United States Patent [19]

Okada et al.

[11] Patent Number: 5,399,890
[45] Date of Patent: Mar. 21, 1995

[54] SEMICONDUCTOR MEMORY DEVICE IN WHICH A CAPACITOR ELECTRODE OF A MEMORY CELL AND AN INTERCONNECTION LAYER OF A PERIPHERAL CIRCUIT ARE FORMED IN ONE LEVEL

[75] Inventors: Shozo Okada, Kobe; Hisashi Ogawa, Katano; Naoto Matsuo, Ibaragi; Yoshiro Nakata, Ikoma; Toshiki Yabu; Susumu Matsumoto, both of Hirakata, all of Japan

[73] Assignee: Matsushita Electric Industrial Co., Ltd., Kadoma, Japan

[21] Appl. No.: 257,955

[22] Filed: Jun. 10, 1994

Related U.S. Application Data

[63] Continuation of Ser. No. 964,720, Oct. 22, 1992, abandoned.

[30] Foreign Application Priority Data

Oct. 24, 1991 [JP] Japan .................................. 3-277419
Feb. 3, 1992 [JP] Japan .................................. 4-017545

[51] Int. Cl.⁶ .......................................... H01L 29/78
[52] U.S. Cl. ................................. 257/306; 257/385; 257/756
[58] Field of Search ............... 257/306, 307, 308, 309, 257/396, 385, 756

[56] References Cited

U.S. PATENT DOCUMENTS

| | | | |
|---|---|---|---|
| 4,754,313 | 6/1988 | Takemae et al. | 257/306 |
| 4,845,544 | 7/1989 | Shimizu | 257/756 |
| 4,931,845 | 6/1990 | Ema | 257/296 |
| 5,140,389 | 8/1992 | Kimura et al. | 257/309 |
| 5,196,910 | 3/1993 | Moriuchi et al. | 257/296 |
| 5,272,367 | 12/1993 | Dennison et al. | 257/306 |
| 5,323,343 | 6/1994 | Ogoh et al. | 257/306 |

OTHER PUBLICATIONS

S. Kimura et al, IEDM 88, 1988 IEEE, pp. 596–599, "A New Capacitor DRAM Cell Characterized by a Storage Capacitor on a Bit-Line Structure".

T. Kikkawa et al, IEDM 91, 1991 IEEE, pp. 281–284, "A Quarter-Micron Interconnection Technology Using, Al-Si-Cu/TiN Alternated Layers".

Primary Examiner—Robert P. Limanek
Attorney, Agent, or Firm—Renner, Otto, Boisselle & Sklar

[57] ABSTRACT

A semiconductor memory of the invention includes a semiconductor substrate having a plurality of transistors, a plurality of stacked capacitors connected to portions of the plurality of transistors, a plurality of first level interconnection layers connected to other portions of the plurality of transistors, and a plurality of second level interconnection layers disposed above the stacked capacitors and the first level interconnection layers. Each of the plurality of stacked capacitors includes a first electrode layer, a capacitance insulating film formed on top of the first electrode layer, and a second electrode layer formed on top of the capacitance insulating film. The second electrode layer is connected to a portion of one of the plurality of second level interconnection layers. At least portions of the plurality of first level interconnection layers are connected to other portions of the plurality of second level interconnection layers. Each of the plurality of first level interconnection layers shares the same layer as at least one of the first electrode layer and the second electrode layer.

8 Claims, 6 Drawing Sheets

SEMICONDUCTOR MEMORY DEVICE IN WHICH A CAPACITOR ELECTRODE OF A MEMORY CELL AND AN INTERCONNECTION LAYER OF A PERIPHERAL CIRCUIT ARE FORMED IN ONE LEVEL

This is a continuation of application Ser. No. 07/964,720, filed on Oct. 22, 1992, now abandoned.

BACKGROUND OF THE INVENTION

1. Field of the Invention:

The present invention relates to a semiconductor memory and a method of fabricating the same, and more particularly to a semiconductor memory having a one-transistor/one-capacitor structure for storing information as a charge in a data storage area (capacitor), and to a method of fabricating such a semiconductor memory.

2. Description of the Prior Art:

Generally, in a semiconductor memory, it is required to decrease the memory cell area with increasing the integration. However, the area of the capacitor portion in the memory cell cannot be made so small, because it is necessary for the capacitor portion to have a certain capacitance. Accordingly, some structures in which the capacitor portion is formed over a transistor have been proposed. For example, a stacked memory cell structure in which the capacitor is formed below the bit line, and a stacked memory cell structure in which the capacitor is formed above the bit line as shown in FIG. 9 have been proposed (S. Kimura, A New Stacked Capacitor DRAM Cell Characterized by a Storage Capacitor on a Bit-line Structure, IEDM Tech. Dig., pp. 596–599, Dec. 1988).

In FIG. 9, isolation regions 52 are formed in a semiconductor substrate 51. Transistors 53a and 53b are formed at the surface of the semiconductor substrate 51. A bit line 54 is formed on the semiconductor substrate 51. A first interlayer insulating film 55 is formed on the entire surface of the semiconductor substrate 51. A contact hole 56 is formed and a node electrode 57 is formed in the contact hole 56 and above the transistor 53a. A capacitance insulating film 58 is formed over the entire surface of the semiconductor substrate 51. A contact hole 58a is formed and a first level interconnection layer 59a is formed. A second interlayer insulating film 510 is formed on the entire top face. A contact hole 511 is formed through the second interlayer insulating film 510, and a second level interconnection layer 512 is formed in the contact hole 511 and on the second interlayer insulating film 510. As shown, the first level interconnection layer 59a is disposed above the capacitor constituted by the node electrode 57, the capacitance insulating film 58, and a plate electrode 59.

As shown in FIG. 9, usually in the prior art structure, the plate electrode 59 and the first level interconnection layer 59a are formed as separate layers. The plate electrode 59 is formed from a single layer of phosphorus-doped polysilicon or the like. The first level interconnection layer 59a is formed in a single layer structure of Al-Si-Cu, etc. or formed in a two-layered structure with an additional layer of a barrier metal such as TiN/Ti, as the underlying layer.

However, in the above prior art structure, since the node electrode 57 and plate electrode 59 of the capacitor are formed only in the memory cell area, the step in level between the memory cell area and the peripheral circuit area becomes larger. Thus, in a later step for forming the first level interconnection layer by photolithography, the focuses are different between the memory cell area and the peripheral circuit area, which causes a problem in terms of patterning accuracy. Furthermore, the increased step at the contact hole 58a in the peripheral circuit area poses a problem as it may lead to the discontinuity of the first level interconnection layer 59a in the contact portion.

On the other hand, with the miniaturization of interconnection patterns, it has been proposed that an interconnection structure consisting of two or more layers, such as a conductive layer of Al-Si-Cu, etc. and a barrier metal of TiN/Ti, etc., should provide better reliability of interconnections in terms of stressmigration and electromigration, as compared with the conventional single layer structure of Al-Si-Cu, etc. (T. Kikkawa, A quarter-micron interconnection technology using Al-Si-Cu/TiN alternated layers, IEDM Tech. Dig., pp. 281–284, Dec. 1991)

SUMMARY OF THE INVENTION

The semiconductor memory of this invention, includes a semiconductor substrate having a plurality of transistors, a plurality of stacked capacitors connected to portions of the plurality of transistors, a plurality of first level interconnection layers connected to other portions of the plurality of transistors, and a plurality of second level interconnection layers disposed above the stacked capacitors and the first level interconnection layers. In the semiconductor memory, each of the plurality of stacked capacitors includes a first electrode layer, a capacitance insulating film formed on top of the first electrode layer, and a second electrode layer formed on top of the capacitance insulating film. The second electrode layer is connected to a portion of one of the plurality of second level interconnection layers, and at least portions of the plurality of first level interconnection layers are connected to other portions of the plurality of second level interconnection layers. Moreover, in the semiconductor memory, each of the plurality of first level interconnection layers shares the same layer as at least one of the first electrode layer and the second electrode layer.

In a preferred embodiment, each of the first level interconnection layers may be formed from the same layer as that forming the first electrode layer.

In a preferred embodiment, each of the first level interconnection layers may be formed from the same layer as that forming the second electrode layer.

In a preferred embodiment, each of the first level interconnection layers may include a lower layer section formed from the same layer as that forming the first electrode layer, and an upper layer section formed over the lower layer section from the same layer as that forming the second electrode layer.

In another preferred embodiment, each of the first level interconnection layers may be formed from at least two layers.

In another preferred embodiment, each of the first level interconnection layers may be formed from three layers.

In another preferred embodiment, each of the first level interconnection layers may be formed from a single layer of a material chemically not easily reactive with the capacitance insulating film nor with the semiconductor substrate.

In another preferred embodiment, the capacitance insulating film may be formed from a ferroelectric material.

According to another aspect of the invention, the method of fabricating a semiconductor memory including a semiconductor substrate having a plurality of transistors, a plurality of stacked capacitors connected to portions of the plurality of transistors, a plurality of first level interconnection layers connected to other portions of the plurality of transistors, and a plurality of second level interconnection layers disposed above the stacked capacitors and the first level interconnection layers, includes the steps of: forming a first conductive film over the transistor after forming the transistor; patterning the first conductive film to form a first electrode layer of the capacitor and a first level interconnection layer from the conductive film; forming a capacitance insulating film of the capacitor on top of the first electrode layer; forming a second electrode layer of the capacitor on top of the capacitance insulating film; and forming a second level interconnection layer, the second level interconnection layer being connected to the second electrode layer and the first level interconnection layer.

Alternatively, the fabricating method of the invention for fabricating a semiconductor memory including a semiconductor substrate having a plurality of transistors, a plurality of stacked capacitors connected to portions of the plurality of transistors, a plurality of first level interconnection layers connected to other portions of the plurality of transistors, and a plurality of second level interconnection layers disposed above the stacked capacitors and the first level interconnection layers, include the steps of: forming a first electrode layer of the capacitor after forming the transistor; forming a capacitance insulating film of the capacitor on top of the first electrode layer; forming at least one contact hole reaching the semiconductor substrate; forming a conductive film over the transistor and the capacitance insulating film; patterning the conductive film to form the first level interconnection layer connected to a portion of the transistor, and a second electrode layer of the capacitor covering the capacitance insulating film, from the conductive film; and forming the second level interconnection layer, the second level interconnection layer being connected to the first level interconnection layer and the second electrode layer.

Alternatively, the fabrication method of the invention for fabricating a semiconductor memory including a semiconductor substrate having a plurality of transistors, a plurality of stacked capacitors connected to portions of the plurality of transistors, a plurality of first level interconnection layers connected to other portions of the plurality of transistors, and a plurality of second level interconnection layers disposed above the stacked capacitors and the first level interconnection layers, includes the steps of: forming a first conductive film over the transistor after forming the transistor; patterning the first conductive film to form a first electrode layer of the capacitor, together with a lower layer section of the first level interconnection layer, from the conductive film; forming a capacitance insulating film of the capacitor on top of the first electrode layer; selectively removing the capacitance insulating film covering the lower layer section of the first level interconnection layer; forming a second conductive film over the capacitance insulating film, which covers the first electrode layer, and over the lower layer section of the first level interconnection layer; patterning the second conductive film and the first conductive film forming the lower layer section of the first level interconnection film, to form a second electrode layer of the capacitor from the second conductive film while forming upper and lower layer sections of the first level interconnection layer respectively from the second conductive film and the first conductive film; and forming the second level interconnection layer, the second level interconnection layer being connected to the second electrode layer and the first level interconnection layer.

Alternatively, the fabrication method of the invention for fabricating a semiconductor memory including a semiconductor substrate having a plurality of transistors, a plurality of stacked capacitors connected to portions of the plurality of transistors, a plurality of first level interconnection layers connected to other portions of the plurality of transistors, and a plurality of second level interconnection layers disposed above the stacked capacitors and the first level interconnection layers, includes the steps of: forming a first electrode layer of the capacitor after forming the transistor; forming a capacitance insulating film of the capacitor on top of the first electrode layer; forming a first conductive film over the capacitance insulating film; patterning the first conductive film to form at least one contact hole reaching the semiconductor substrate; forming a second conductive film having at least one layer on top of the patterned first conductive film, and contacting the second conductive film with the semiconductor substrate through the contact hole; patterning the first and second conductive films to form a second electrode of the capacitor and the first level interconnection layer from the first and second conductive films; and forming the second level interconnection layer, the second level interconnection layer being connected to the second electrode layer and the first level interconnection layer.

With the above mentioned structure of the present invention, the step in level between the memory cell area and the peripheral circuit area can be reduced by a size equivalent to the thickness of at least one of the electrodes of the capacitor in the memory cell area. This contributes to make the patterning easier when forming the first level interconnection layer by photolithography. Furthermore, since the thickness of the interlayer insulating film underlying the first level interconnection layer in the peripheral circuit area can be reduced by a size equivalent to the thickness of the interlayer insulating film that was formed, in the prior art, between the plate electrode and the first level interconnection layer, the structure of the present invention serves to prevent the discontinuity of the first level interconnection layer in the contact portion with the underlying layer.

Moreover, when the first level interconnection layer is formed in a three-layered structure, the reliability thereof can be increased as compared with the conventional single- or two-layered structure of Al-Si-Cu, barrier metal, etc.

Thus, the invention described herein makes possible the advantage of providing a semiconductor memory and a method of fabricating the same, which prevents the discontinuity of the first level interconnection layer in the contact portion with the underlying layer and eases the patterning over the steps during a photolithographic process, thereby enhancing the reliability of the first level interconnection layer.

These and other advantages of the present invention will become apparent to those skilled in the art upon reading and understanding the following detailed description with reference to the accompanying figures.

DESCRIPTION OF THE PREFERRED EMBODIMENTS

The preferred embodiment of the present invention will now be described with reference to the accompanying drawings.

EXAMPLE 1

Figure 1:
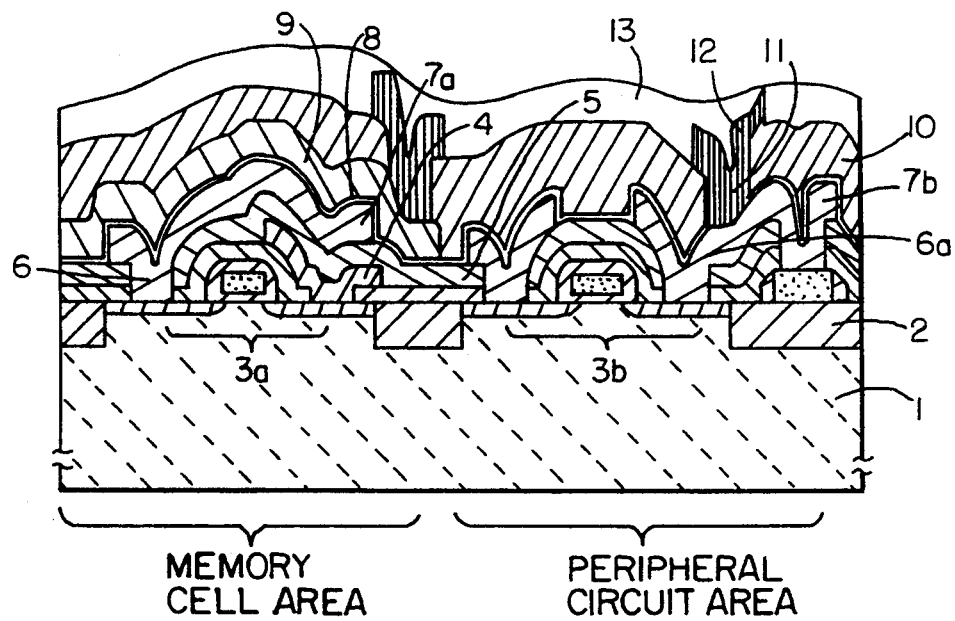
FIG. 1 is a sectional view showing a structure of a dynamic random access memory (DRAM) as a first example of a semiconductor memory according to the invention.

FIG. 1 is a sectional view showing a structure of a DRAM as a first example of a semiconductor memory of the present invention. In FIG. 1, isolation regions 2 are formed in a semiconductor substrate 1. Transistors 3a and 3b are formed at the surface of the semiconductor substrate 1. A bit line 4 is formed on the transistor 3a. A first interlayer insulating film 5 is formed on the entire surface of the semiconductor substrate 1. Contact holes 6 and 6a are simultaneously formed. Then, a node electrode 7a and a first level interconnection layer 7b are formed using the same layer, which are respectively connected to the semiconductor substrate 1 through the prescribed contact holes 6 and 6a formed thereon. A capacitance insulating film 8 is disposed over the entire surface of the semiconductor substrate 1. A plate electrode 9 is formed above the transistor 3a. The node electrode 7a, the capacitance insulating film 8 and the plate electrode 9 constitute a capacitor. A second interlayer insulating film 10 is formed over the entire top surface. Contact holes 11, and then a second level interconnection layer 12 are formed. The second level interconnection layer 12 is connected to the first level interconnection layer 7b and the plate electrode 9 through the prescribed contact holes 11 opened in the second interlayer insulating film 10. Then, a surface protective film 13 covers the entire top face.

The above-described DRAM comprises: a capacitor, for storing information as a charge, formed from the node electrode 7a, the capacitance insulating film 8, and the plate electrode 9; the bit line 4 for transferring the charge to and from an external circuit; the first level interconnection layer 7b; the second level interconnection layer 12; and the transistors 3a and 3b.

As described, according to this example, the step in level between the memory cell area and the peripheral circuit area can be reduced by a size equivalent to the thicknesses of the lower electrode and upper electrode of the memory cell capacitor. This contributes to the accurate patterning when forming the first level interconnection layer by photolithography. Furthermore, since the thickness of the interlayer insulating film underlying the first level interconnection layer can be reduced by a size equivalent to the thickness of the interlayer insulating film that was formed, in the prior art, between the plate electrode and the first level interconnection layer, the structure of this example serves to prevent the discontinuity of the first level interconnection layer in the contact portion with the underlying layer.

Figure 2A:
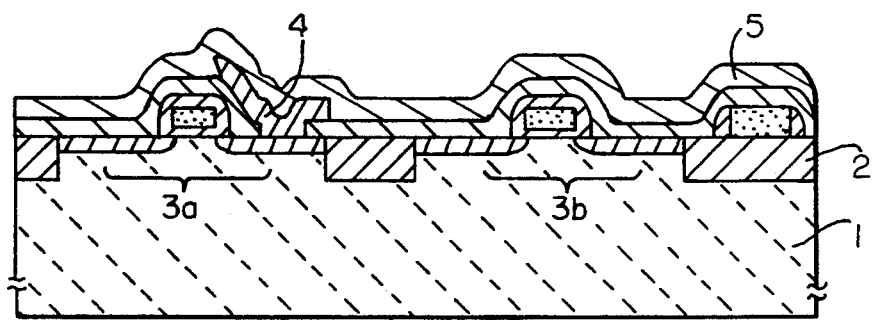
FIGS. 2A through 2C are cross sectional views illustrating a fabrication process sequence for the semiconductor memory in the first example according to the invention.
Figure 2B:
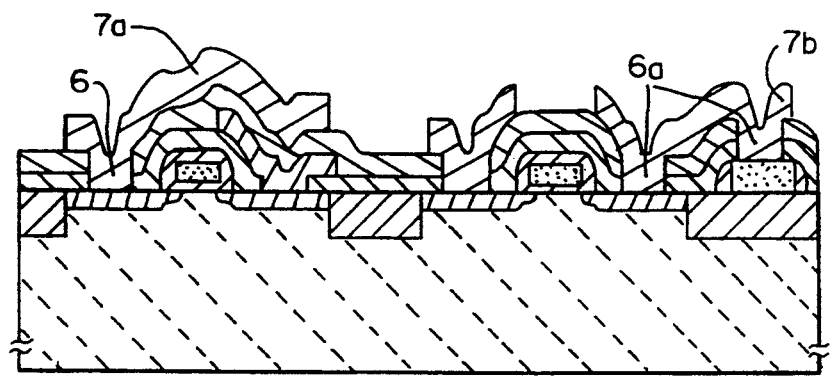
Figure 2C:
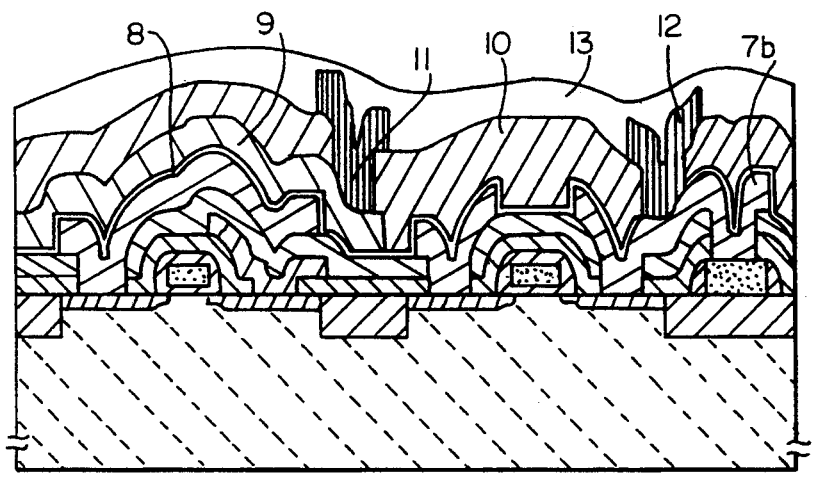

FIGS. 2A through 2C are cross sectional views illustrating a fabrication process sequence for the semiconductor memory according to the present invention.

First, as shown in FIG. 2A, the isolation region 2, formed, for example, by a conventional local oxidation of silicon (LOCOS) process or by a buried-isolation method using an insulating film, and the transistors 3a and 3b are formed on the semiconductor substrate 1, on which the bit line 4 of a metal or its silicide or polycide is formed by photolithography and etching techniques, and further, the first interlayer insulating film 5 is deposited using, for example, a chemical vapor deposition (CVD) process.

Next, as shown in FIG. 2B, the contact holes 6 and 6a respectively reaching designated regions of the memory cell and peripheral circuit areas are simultaneously formed by photolithography and etching techniques, after which a conductive layer is formed by CVD or sputtering. Thereafter, the conductive layer is patterned by photolithography and etching techniques in designated regions to simultaneously form the node electrode 7a and the first level interconnection layer 7b. The conductive layer can be formed, by CVD or sputtering, in a single-layer or multilayered structure using a material or materials chemically not easily reactive with the substrate nor with the capacitance insulating film, such material being selected from the group consisting of a barrier metal such as TiN, a metal such as W, Al-Si-Cu, Cu, Au, or Pt, its silicide, and polysilicon. In the case of the multilayered structure, the reliability of the first level interconnection layer 7b increases as compared with the single-layer structure. Then, as shown in FIG. 2C, the capacitance insulating film 8, such as an oxidenitride-oxide (ONO) film or a ferroelectric film, is formed by CVD or sputtering, over which a material chemically not easily reactive with the capacitance insulating film, such material being selected from the group consisting of a barrier metal such as TiN, a metal such as W, Al-Si-Cu, Cu, Au, or Pt, its silicide, and polysilicon, is deposited by CVD or sputtering and then etched to form the prescribed plate electrode 9 by photolithography and etching techniques. Thereafter, a silicon oxide film or the like is formed, for example, by CVD, to form the second interlayer insulating film 10, and the contact holes 11 reaching designated regions of the plate electrode 9 and first level interconnection layer 7b are opened through the second interlayer insulating film 10 by photolithography and etching techniques. Then, a metallization material such as an aluminum based metal, W, Cu, etc. is deposited by CVD or sputtering, for example, and etched to form the second level interconnection layer 12 by photolithography and etching techniques (description of the surface protective film 13 formed thereabove is omitted herein).

EXAMPLE 2

Figure 3:
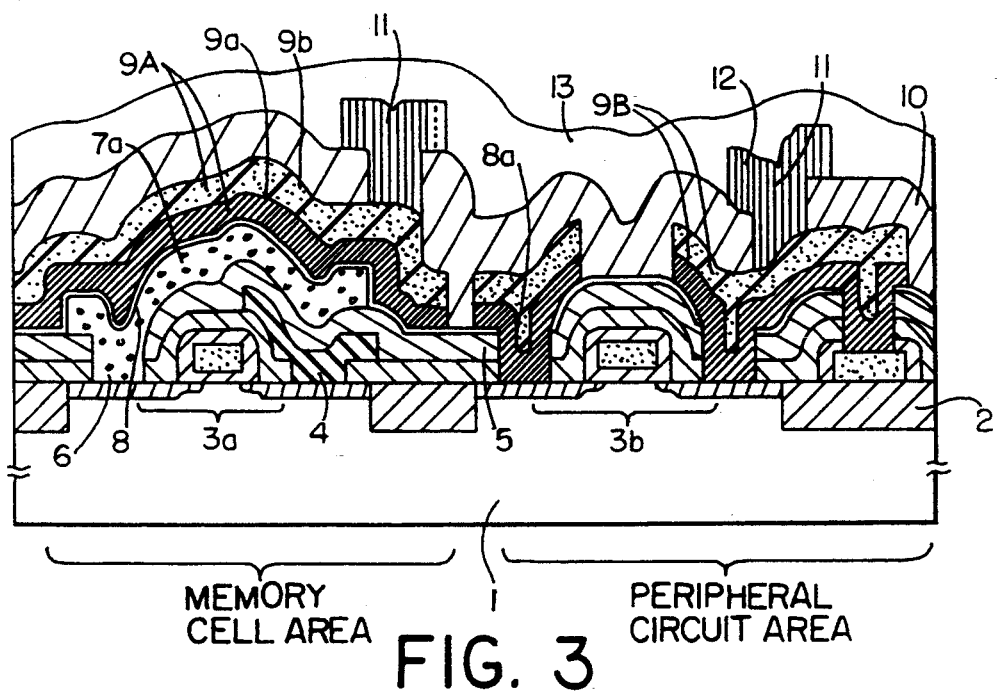
FIG. 3 is a sectional view showing a structure of a DRAM as a second example of a semiconductor memory according to the invention.

FIG. 3 shows a cross sectional view of a DRAM as a second example of the semiconductor memory of the present invention. In FIG. 3, isolation regions 2 are formed in a semiconductor substrate 1. Transistors 3a and 3b are formed at the surface of the semiconductor substrate 1. A bit line 4 is formed on the transistor 3a. An interlayer insulating film 5 is formed on the entire surface of the semiconductor substrate 1. A contact hole 6 and a node electrode 7a are formed, respectively. A capacitance insulating film 8 is disposed on the entire surface of the semiconductor substrate 1. A contact hole 8a is formed through to the semiconductor substrate 1. After successively forming a first conductive film 9a and a second conductive film 9b for connection to the semiconductor substrate 1 through the contact hole 8a, a first level interconnection layer 9B and a plate electrode 9A are both formed in a two-layered structure using the first conductive film 9a and second conductive film 9b. An interlayer insulating film 10 is formed on the entire surface of the semiconductor substrate. Contact holes 11 are formed in the interlayer insulating film 10. Thereafter, a second level interconnection layer 12 is formed which is connected to the plate electrode 9A and the first level interconnection layer 9B through the contact holes 11 opened in designated regions of the interlayer insulating film 10. Then, a surface protective film 13 covers the entire top face.

The above-described DRAM comprises: a capacitor, for storing information as a charge, formed from the node electrode 7a, the capacitance insulating film 8, and the plate electrode 9A formed from the two-layered conductive film of the first conductive film 9a and second conductive film 9b; the bit line 4 for transferring the charge to and from an external circuit; the first level interconnection layer 9B formed from the two-layered conductive film of the same first conductive film 9a and second conductive film 9b as those forming the plate electrode 9A; the second level interconnection layer 12; and the transistors 3a and 3b.

As described, according to this example, the step in level between the memory cell area and the peripheral circuit area can be reduced by a size equivalent to the thickness of the upper electrode of the memory cell capacitor. This contributes to the accurate patterning when forming the first level interconnection layer by photolithography. Furthermore, since the thickness of the interlayer insulating film underlying the first level interconnection layer can be reduced by a size equivalent to the thickness of the interlayer insulating film that was formed, in the prior art, between the plate electrode and the first level interconnection layer, the structure of this example serves to prevent the discontinuity of the first level interconnection layer in the contact portion with the underlying layer. Moreover, the reliability of the first level interconnection layer is enhanced because of the multilayer-structured conductive film. In this example, the second conductive film 9b is formed on top of the first conductive film 9a, but it will be recognized that a single-layer structure of the first conductive film 9a only can also achieve the same effects as described above except for the effect of increasing the reliability of interconnections.

Figure 4A:
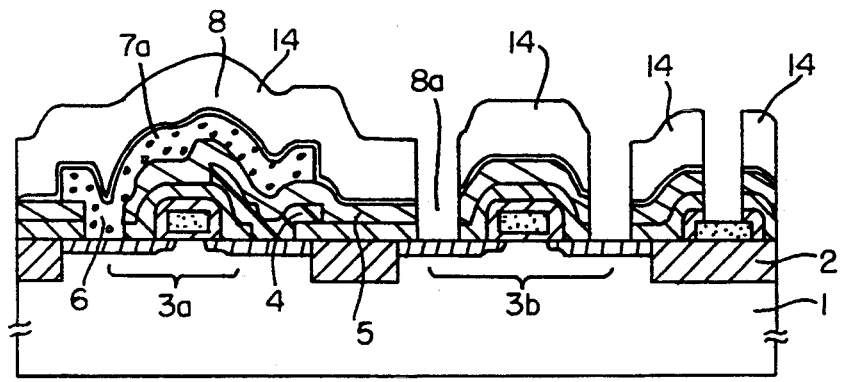
FIGS. 4A through 4C are cross sectional views illustrating a fabrication process sequence for the semiconductor memory in the second example according to the invention.
Figure 4B:
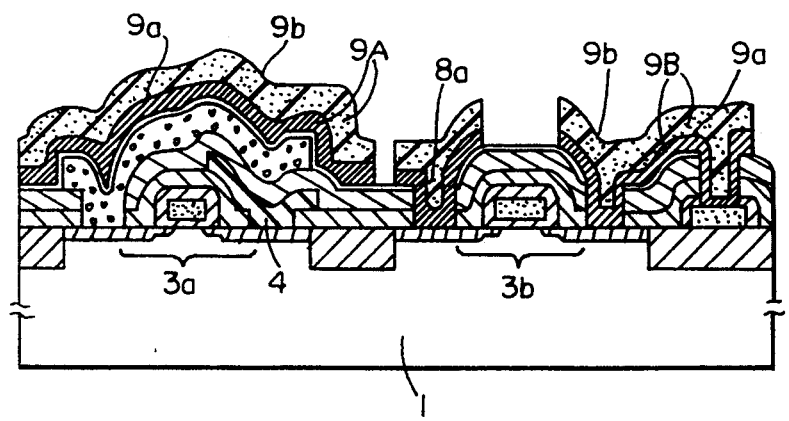
Figure 4C:
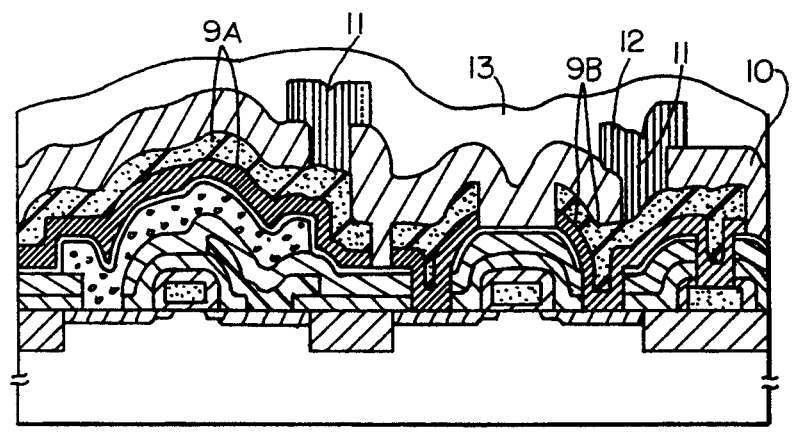

FIGS. 4A through 4C are cross sectional views illustrating a fabrication process sequence for the semiconductor memory according to the present invention.

First, as shown in FIG. 4A, the isolation regions 2, formed for example by a conventional LOCOS process or by a buried-isolation method, and the transistors 3a and 3b are formed on the semiconductor substrate 1, on which the bit line 4 of a metal or its silicide or polycide is formed by photolithography and etching techniques and further, a silicon oxide film or the like is formed, for example, by CVD, to form the interlayer insulating film 5. The contact holes 6 to designated regions of the substrate and the node electrode 7a of a metal, its silicide, or polysilicon are respectively formed by photolithography and etching techniques. Thereafter, the capacitance insulating film 8, such as an ONO film or a ferroelectric film, is formed, and by photography and etching techniques using a photoresist 14, the contact holes 8a to designated regions are opened in designated regions of the underlying interlayer insulating film. Since the capacitance insulating film is also etched during the etching of the contact holes, it is desirable that the capacitance insulating film be formed from a film of adequate thickness and preferably from a ferroelectric film that can provide a high capacitance value.

Next, as shown in FIG. 4B, using a CVD process or a sputtering technique, the first conductive film 9a and the second conductive film 9b are successively formed which connect through the contact holes 8a to designated regions of the semiconductor substrate 1, the gate electrodes of the transistors 3a and 3b, and the bit line 4, after which the first and second conductive films 9a and 9b are etched by photolithography and etching techniques to simultaneously form the plate electrode 9A and the first level interconnection layer 9B which are thus formed with two layers of conductive films. The first conductive film 9a can be formed, by CVD or sputtering, using a material chemically not easily reactive with the capacitance insulating film nor with the substrate, such material being selected from the group consisting of a barrier metal such as TiN, a metal such as W, Al-Si-Cu, Cu, Au, or Pt, its silicide, and polysilicon, while the second conductive film 9b can be formed, by CVD or sputtering, using a metal such as W, aluminum, or Cu. If the reliability of the first level interconnection layer 9B can be secured, the first level interconnection layer 9B may be formed from the first conductive film 9a only.

Next, as shown in FIG. 4C, a silicon oxide film or the like is formed, for example, by CVD, to form the interlayer insulating film 10, and the contact holes 11 to designated regions of the plate electrode 9A and first level interconnection layer 9B are opened through the interlayer insulating film 10 by photolithography and etching techniques. Then, after depositing aluminum or Cu-based metal by CVD or sputtering, for example, the second level interconnection layer 12 is formed by photolithography and etching techniques (description of the surface protective film 13 formed thereabove is omitted herein).

EXAMPLE 3

Figure 5:
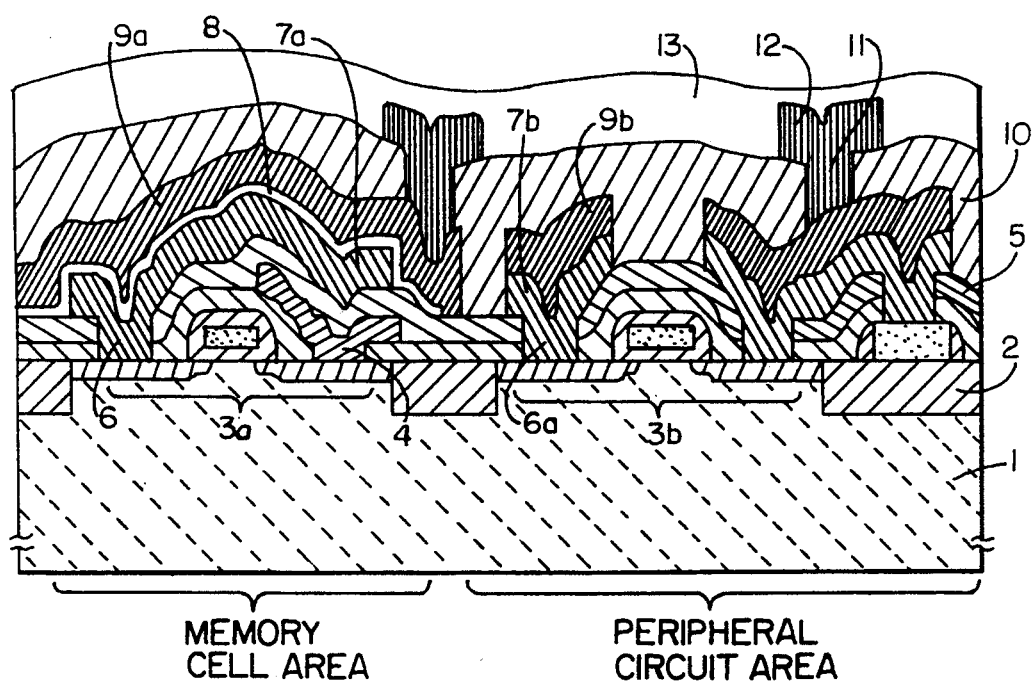
FIG. 5 is a sectional view showing a structure of a DRAM as a third example of a semiconductor memory according to the invention.

FIG. 5 shows a cross sectional view of a DRAM as a third example of the semiconductor memory of the present invention. In FIG. 5, isolation regions 2 are formed in a semiconductor substrate 1. Transistors 3a and 3b are formed at the surface of the semiconductor substrate 1. A bit line 4 is formed on the transistor 3a. A first interlayer insulating film 5 is formed on the entire surface of the semiconductor substrate 1. Contact holes 6 and 6a are formed simultaneously. Over the thus formed structure, a node electrode 7a and a lower region 7b of a first level interconnection layer, both connected to the semiconductor substrate 1 through the respective contact holes 6 and 6a, are formed from the same layer. On the node electrode 7a, a capacitor is formed from a capacitance insulating film 8 and a plate electrode 9a, and an upper region 9b of the first level interconnection layer is formed above the lower region 7b thereof. Then, a second interlayer insulating film 10 is formed over the entire surface of the semiconductor substrate 1. Contact holes 11, and then a second level interconnection layer 12 are formed. The second level interconnection layer 12 is connected to the upper region 9b of the first level interconnection layer and the plate electrode 9a respectively through the contact holes 11 opened in the second interlayer insulating film 10. Then, a surface protective film 13 covers the entire top face.

The DRAM described above comprises: a capacitor, for storing information as a charge, formed from the node electrode 7a, the capacitance insulating film 8, and the plate electrode 9a; the bit line 4 for transferring the charge to and from an external circuit; the lower region 7b and upper region 9b of the first level interconnection layer; the second level interconnection layer 12; and the transistors 3a and 3b.

As described, according to this example, the step in level between the memory cell area and the peripheral circuit area can be reduced by a size equivalent to the thicknesses of the lower electrode and upper electrode of the memory cell capacitor. This contributes to the accurate patterning when forming the first level interconnection layer by photolithography. Furthermore, since the thickness of the interlayer insulating film underlying the first level interconnection layer can be reduced by a size equivalent to the thickness of the interlayer insulating film that was formed, in the prior art, between the plate electrode and the first level interconnection layer, the structure of this embodiment serves to prevent the discontinuity of the first level interconnection layer in the contact portion with the underlying layer. Moreover, the reliability of the first level interconnection layer is enhanced because of the multilayer-structured conductive film.

FIGS. 6A through 6D are cross sectional views illustrating a fabrication process sequence for the semiconductor memory according to the present invention.

Figure 6A:
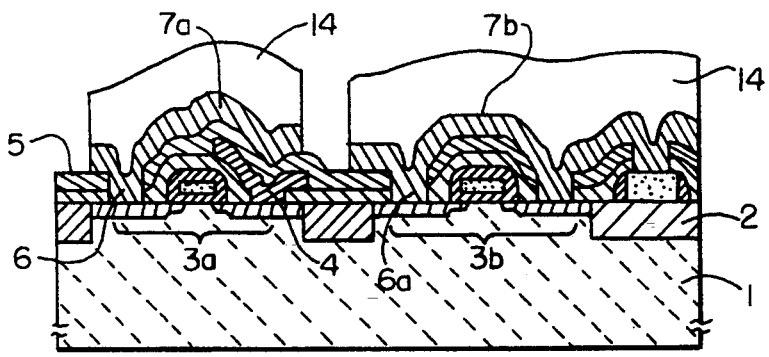
FIGS. 6A through 6D are cross sectional views illustrating a fabrication process sequence for the semiconductor memory in the third example according to the invention.

First, as shown in FIG. 6A, the isolation regions 2, formed for example by a conventional LOCOS process or by a buried-isolation method using an insulating film, and the transistors 3a and 3b are formed on the semiconductor substrate 1, on which the bit line 4 of a metal or its silicide or polycide is formed by photolithography and etching techniques and further, the first interlayer insulating film 5 is deposited using, for example, a CVD process. Then, after contact holes 6 and 6a to designated regions of the memory cell and peripheral circuit areas are formed simultaneously by photolithography and etching techniques using a photoresist 14, a conductive layer is formed by CVD or sputtering. Thereafter, the conductive layer is patterned by photolithography and etching techniques to simultaneously form the node electrode 7a and the lower region 7b of the first level interconnection layer at respectively designated regions. The conductive layer can be formed, by CVD or sputtering, in a single or multilayered structure using a material or materials chemically not easily reactive with the substrate nor with the capacitance insulating film, such material being selected from the group consisting of a barrier metal such as TiN, a metal such as W, Al-Si-Cu, Cu, Au, or Pt, its silicide, and polysilicon. In the case of the multilayered structure, the reliability of the first level interconnection layer increases as compared with the single-layer structure.

Figure 6B:
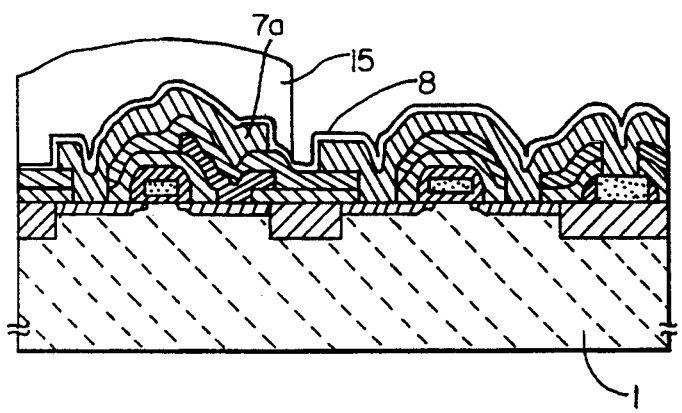

Next, as shown in FIG. 6B, the capacitance insulating film 8, such as an ONO film or a ferroelectric film, is formed over the entire surface of the semiconductor substrate 1 by CVD or sputtering, and then etched selectively by photolithography and etching techniques using a photoresist 15 so that the unetched portions of the capacitance insulating film 8 cover the node electrode 7a.

Figure 6C:
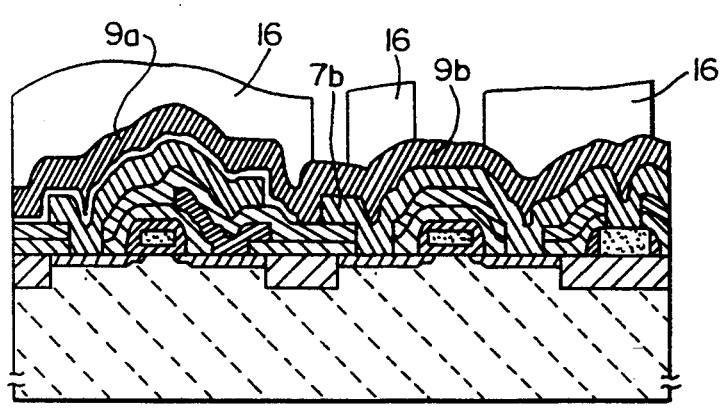
Figure 6D:
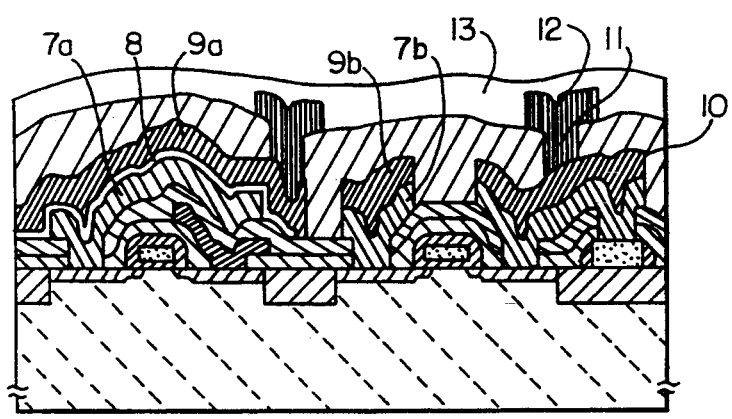

Then, as shown in FIG. 6C, a material or materials chemically not easily reactive with the capacitance insulating film, such material being selected from the group consisting of a barrier metal such as TiN, a metal such as W, Al-Si-Cu, Cu, Au, or Pt, its silicide, and polysilicon, is deposited by CVD or sputtering in a single layer or multiple layers, and the layer or layers are then etched in designated regions by photolithography and etching techniques using a photoresist 16 to form the plate electrode 9a and the lower and upper regions 7b and 9b of the first level interconnection layer. Thereafter, as shown in FIG. 6D, a silicon oxide film or the like is formed, for example, by CVD, to form the second interlayer insulating film 10, and the contact holes 11 to designated regions of the plate electrode 9a and the upper region 9b of the first level interconnection layer are opened through the second interlayer insulating film 10 by photolithography and etching techniques. Then, a metallization material such as aluminum-based metal, W, or Cu is deposited by CVD or sputtering, for example, and etched by photolithography and etching techniques to form the second level interconnection layer 12 (description of the surface protective film 13 formed thereabove is omitted herein).

EXAMPLE 4

Figure 7:
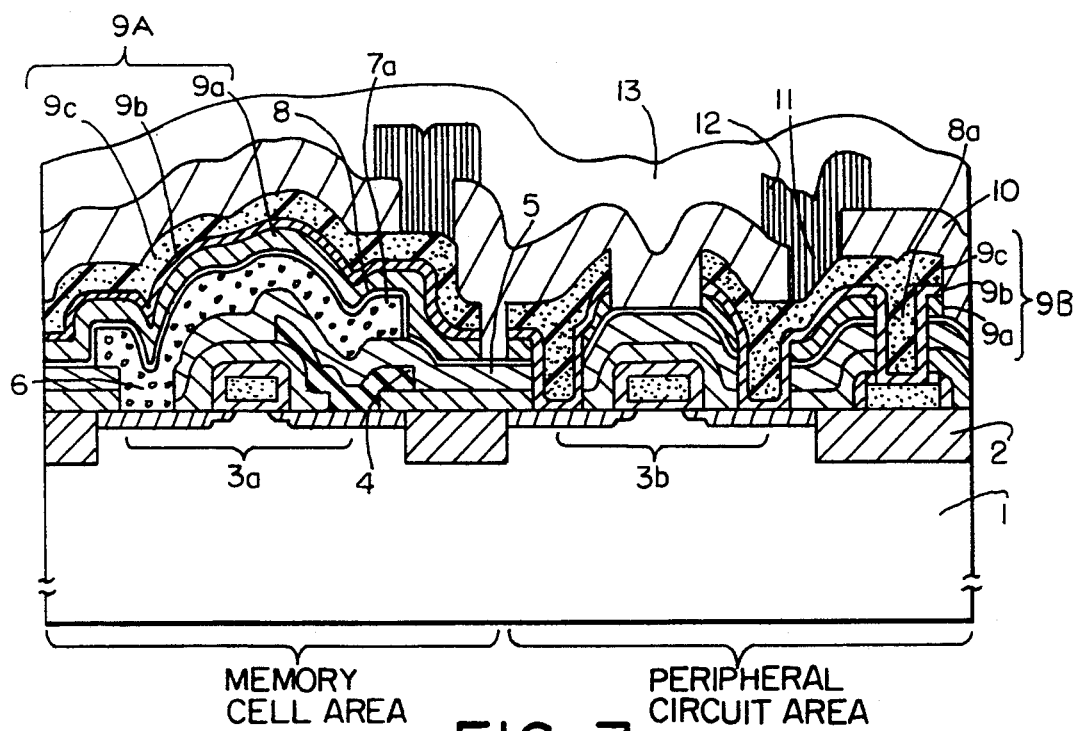
FIG. 7 is a sectional view showing a structure of a DRAm as a fourth example of a semiconductor memory according to the invention.

FIG. 7 shows a cross sectional view of a DRAM as a fourth example of the semiconductor memory of the present invention. In FIG. 7, isolation regions 2 are formed in a semiconductor substrate 1. Transistors 3a and 3b are formed at the surface of the semiconductor substrate 1. A bit line 4 is formed on the transistor 3a. An interlayer insulating film 5 is formed on the entire surface of the semiconductor substrate 1. A contact hole 6 and a node electrode 7 are formed. A capacitance insulating film 8 is formed over the entire surface of the semiconductor substrate 1. A first conductive film 9a is formed, and then contact holes 8a are formed. Over the thus formed structure, second and third conductive films 9b and 9c are successively formed which connect to the first conductive film 9a in the upper portions of the contact holes 8a and to the semiconductor substrate 1 at the bottom thereof. Thereafter, a first level interconnection layer 9B and a plate electrode 9A are formed with the same three-layered conductive film consisting of the first, second, and third conductive films 9a, 9b, and 9c. An interlayer insulating film 10 and contact holes 11 are formed. Then, a second level interconnection layer 12 is formed which is connected to the plate electrode 9A and the first level interconnection layer 9B through the prescribed contact holes 11 opened in the interlayer insulating film 10. Then, a surface protective film 13 covers the entire top face.

The DRAM described above comprises: a capacitor, for storing information as a charge, formed from the node electrode 7, the capacitance insulating film 8, and the plate electrode 9A formed with the three-layered conductive film consisting of the first, second, and third conductive films 9a, 9b, and 9c; the bit line 4 for transferring the charge to and from an external circuit; the first level interconnection layer 9B formed with the three-layered conductive film consisting of the same first, second, and third conductive films 9a, 9b, and 9c as those forming the plate electrode 9A; the second level interconnection layer 12; and the transistors 3a and 3b.

As described, according to this example, the step in level between the memory cell area and the peripheral circuit area can be reduced by a size equivalent to the thickness of the upper electrode of the memory cell capacitor, which contributes to the accurate patterning when forming the first level interconnection layer by photolithography. Furthermore, since the thickness of the interlayer insulating film underlying the first level interconnection layer can be reduced by a size equivalent to the thickness of the interlayer insulating film that was formed, in the prior art, between the plate electrode and the first level interconnection layer, the structure of this example serves to prevent the discontinuity of the first level interconnection layer in the contact portion with the underlying layer. Moreover, the reliability of the first level interconnection layer is enhanced because of the multilayer-structured conductive film. In this example, the second and third conductive films 9b and 9c are formed over the first conductive film 9a, but it will be recognized that the same effect can be obtained if the construction is a two-layered structure in which only the second conductive film 9b is formed over the first conductive film 9a. Table 1 shows how much improvement in the reliability can be achieved when, in the present invention, the first interconnection layer is formed with a three-layered structure, as compared with a two-layered structure, in various combinations of the first, second, and third conductive films.

FIGS. 8A through 8D are cross sectional views illustrating a fabrication process sequence for the semiconductor device according to the present invention.

Figure 8A:
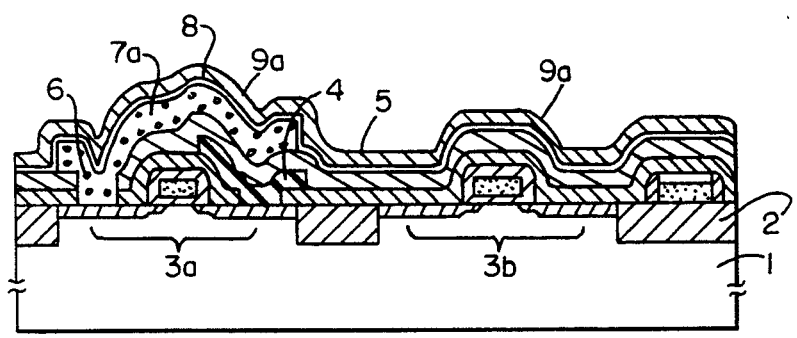
FIGS. 8A through 8D are cross sectional views illustrating a fabrication process sequence for the semiconductor memory in the fourth example according to the invention.
Figure 8B:
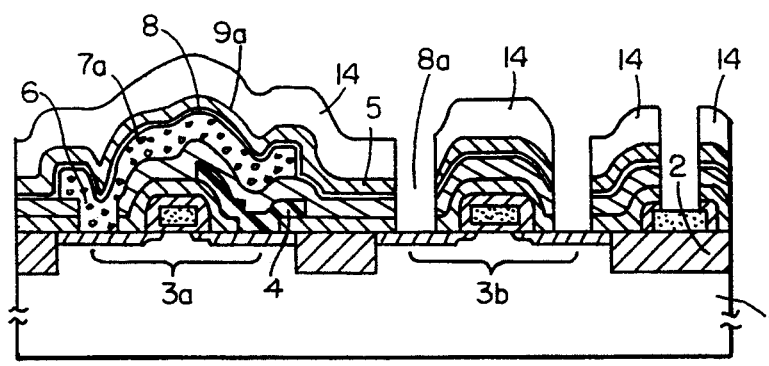

First, as shown in FIG. 8A, the isolation regions 2, formed for example by a conventional LOCOS process or by a buried-isolation method using an insulating film, and the transistors 3a and 3b are formed on the semiconductor substrate 1, on which the bit line 4 of a metal or its silicide or polycide is formed by photolithography and etching techniques, the interlayer insulating film 5, such as a silicon oxide film, is formed using, for example, a CVD process, and further, the contact hole 6 to a designated region and the node electrode 7a of a metal or its silicide or polycide are respectively formed by photolithography and etching techniques. Then, the capacitance insulating film 8, such as an ONO film or a ferroelectric film, and the first conductive film 9a are formed, after which, as shown in FIG. 8B, the contact holes 8a are formed by photolithography and etching techniques using a photoresist 14. The contact holes 8a pass through designated regions of the first conductive film 9a, capacitance insulating film 8, and underlying interlayer insulating film and reach designated regions. The first conductive film 9a acts as a protective film for the capacitance insulating film 8 and can be formed by CVD or sputtering using a material chemically not easily reactive with the capacitance insulating film 8, such material being selected from the group consisting of a barrier metal such as TiN, a metal such as W, Al-Si-Cu, Cu, Au, or Pt, its silicide, and polysilicon.

Figure 8C:
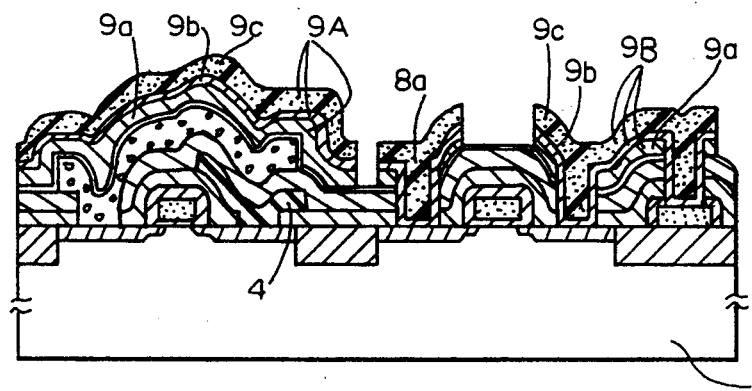

Next, as shown in FIG. 8C, using a CVD process or a sputtering technique, the second conductive film 9b and the third conductive film 9c are successively formed which connect through the contact holes 8a to designated regions of the semiconductor substrate 1, the gate electrode of the transistor 3b, and the bit line 4 and which also connect to the first conductive layer 9a in the upper portions of the contact holes 8a. Then, the three conductive films 9a, 9b, and 9c are etched by photolithography and etching techniques to simultaneously form the plate electrode 9A and the first level interconnection layer 9B of a three-layered structure. The second conductive film 9b can be formed from a material, such as a barrier metal like TiN or TiW, chemically not easily reactive with the substrate, and the third conductive film 9c from a metal such as W, aluminum, or Cu, by CVD or sputtering.

Figure 8D:
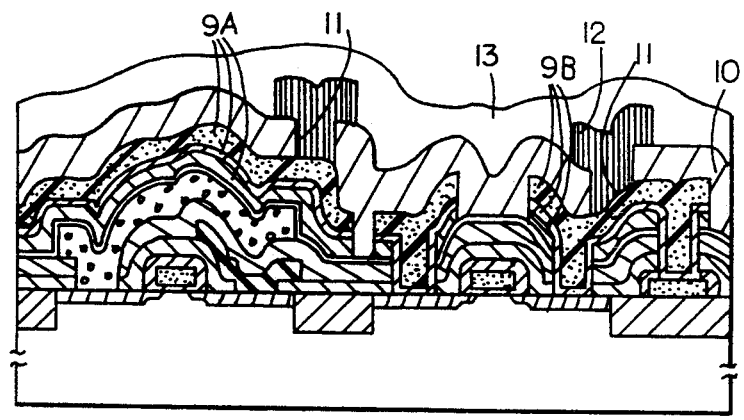
Figure 9:
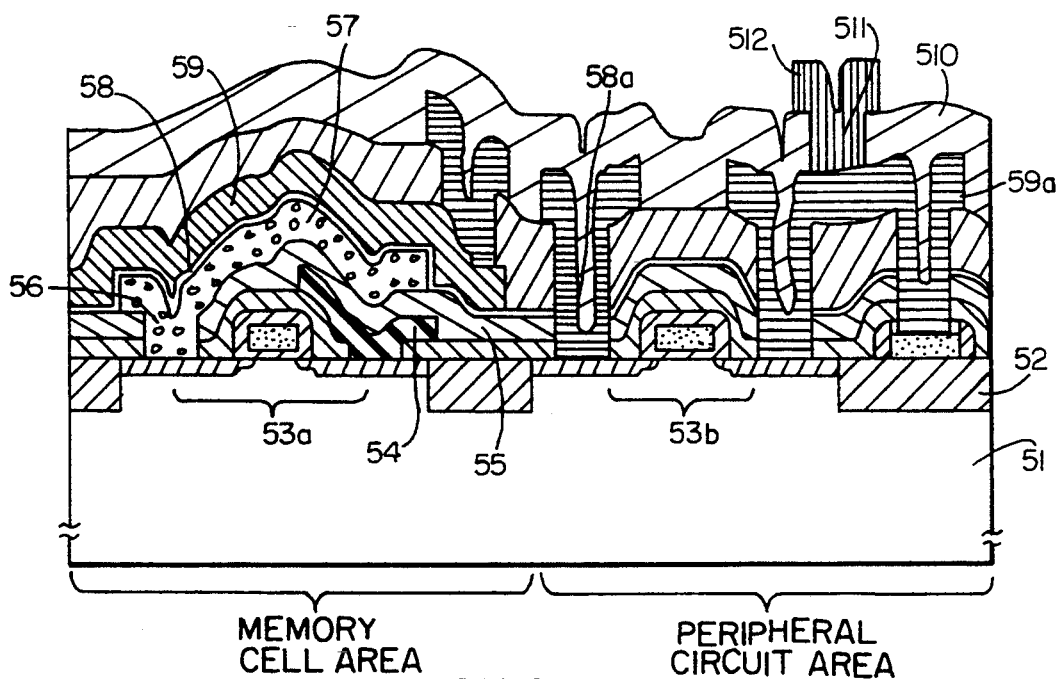
FIG. 9 is a sectional view showing a structure of a semiconductor memory of a prior art.

Next, as shown in FIG. 8D, the interlayer insulating film 10, such as a silicon oxide film, is formed, for example, by CVD, and then, the contact holes 11 are formed by photolithography and etching techniques through the interlayer insulating film 10 for connection to designated regions of the plate electrode 9A and first level interconnection layer 9B. Then, after depositing a metal such as aluminum or Cu by CVD or sputtering, the second level interconnection layer 12 is formed by photolithography and etching techniques (description of the surface protective film 13 formed thereabove is omitted herein).

As described above, according to the present invention, the step in level between the memory cell area and the peripheral circuit area can be reduced by a size equivalent to the thickness of at least one of the electrodes of the memory cell capacitor. This contributes to the accurate patterning when forming the first level interconnection layer by photolithography. Furthermore, since the step in the contact portion with the substrate in the peripheral circuitry area can be reduced by a size equivalent to the thickness of the interlayer insulating film that was formed, in the prior art, between the plate electrode and the first level interconnection layer, the structure of the invention serves to prevent the discontinuity of the first level interconnection layer in the contact portion with the underlying layer, thus offering an enormous practical advantage. It will also be recognized that, while in the prior art the plate electrode and first level interconnection layer are formed in separate photolithography and etching steps, the present invention achieves the formation of these in a single photolithography and etching step, thereby simplifying the fabrication process. Moreover, when the first level interconnection layer is formed in a three-layered structure, the reliability thereof increases as compared with the conventional single- or two-layered structure, as shown in Table 1. As seen from Table 1, by using TiN or TiW for the second conductive film, and using Al-Si-Cu or W for the first and third conductive film, stressmigration or electromigration is prevented, so that the reliability of the first level interconnection layer is remarkably improved. Especially when the first conductive film is formed from Al-Si-Cu, the wiring resistance can be reduced.

In the above examples, the present invention has been described with respect to a stacked memory cell structure in which a capacitor is formed on a bit line. However, it will be appreciated that the purpose of the invention is not affected by the vertical positional relationship between the bit line and the capacitor.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

first electrode layer and said second electrode layer, and said first level interconnection layers serve to interconnect said other portions of said plurality of transistors in said peripheral circuit area.

2. A semiconductor memory according to claim 1, wherein each of said first level interconnection layers is formed from the same layer as that forming said first electrode layer.

3. A semiconductor memory according to claim 1, wherein each of said first level interconnection layers is formed from the same layer as that forming said second electrode layer.

4. A semiconductor memory comprising a semiconductor substrate having a plurality of transistors, a plurality of stacked capacitors connected to portions of said plurality of transistors, a plurality of first level interconnection layers connected to other portions of said plurality of transistors, and a plurality of second

TABLE 1

| | THREE-LAYERED STRUCTURE OF EXAMPLE | | | IMPROVEMENT COMPARED WITH CONVENTIONAL STRUCTURE Third Conductive Film or Second (barrier metal) Conductive Film/Third Conductive Film | |
|---|---|---|---|---|---|
| Case No. | First Conductive Film (lower layer) | Second Conductive Film (intermediate layer) | Third Conductive Film (upper layer) | RELIABILITY STRESS MIGRATION, ELECTROMIGRATION | WIRING RESISTANCE |
| 1 | Al—Si—Cu | TiN | Al—Si—Cu | Remarkably improved | Reduced |
| 2 | W | TiN | Al—Si—Cu | Remarkably improved | Not changed |
| 3 | Al—Si—Cu | TiN | W | Remarkable improved | Reduced |
| 4 | W | TiN | W | Remarkable improved | Reduced |
| 5 | Al—Si—Cu | TiW | Al—Si—Cu | Remarkable improved | Reduced |
| 6 | W | TiW | Al—Si—Cu | Remarkable improved | Not changed |
| 7 | Al—Si—Cu | TiW | W | Remarkable improved | Reduced |
| 8 | W | TiW | W | Remarkable improved | Reduced |
| 9 | $WSi_2$ | TiN | Al—Si—Cu | A little improved | Not changed |
| 10 | $WSi_2$ | TiN | W | A little improved | Not changed |
| 11 | Phosphorus-doped PolySi | TiN | Al—Si—Cu | Less improved | Not changed |
| 12 | Phosphorus-doped PolySi | TiN | W | Less improved | Not changed |
| 13 | TiN/Ti | TiN | Al—Si—Cu | Less improved | Not changed |
| 14 | TiN/Ti | TiN | W | Less improved | Not changed |
| 15 | TiW | TiW | Al—Si—Cu | Less improved | Not changed |
| 16 | TiW | TiW | W | Less improved | Not changed |

What is claimed is:

1. A semiconductor memory comprising a semiconductor substrate having a plurality of transistors, a plurality of stacked capacitors connected to portions of said plurality of transistors to form a memory cell area, a plurality of first level interconnection layers connected to other portions of said plurality of transistors to form a peripheral circuit area, and a plurality of second level interconnection layers disposed above said stacked capacitors and said first level interconnection layers, wherein each of said plurality of stacked capacitors comprises a first electrode layer, a capacitance insulating film formed on top of said first electrode layer, and a second electrode layer formed on top of said capacitance insulating film, said second electrode layer being connected to a portion of one of said plurality of second level interconnection layers, at least portions of said plurality of first level interconnection layers are connected to other portions of said plurality of second level interconnection layers, and each of said plurality of first level interconnection layers shares the same layer as at least one of said level interconnection layers disposed above said stacked capacitors and said first level interconnection layers.

each of said plurality of stacked capacitors comprising a first electrode layer, a capacitance insulating film formed on top of said first electrode layer, and a second electrode layer formed on top of said capacitance insulating film, said second electrode layer being connected to a portion of one of said plurality of second level interconnection layers.

at least portions of said plurality of first level interconnection layers being connected to other portions of said plurality of second level interconnection layers.

each of said plurality of first level interconnection layers sharing the same layer as at least one of said first electrode layer and said second electrode layer, and wherein each of said first level interconnection layers comprises a lower layer section formed from the same layer as that forming said first electrode layer, and an upper layer section formed over said lower layer section from the same layer as that forming said second electrode layer.

5. A semiconductor memory according to claim 1, wherein each of said first level interconnection layers is formed from at least two layers.

6. A semiconductor memory according to claim 5, wherein each of said first level interconnection layers is formed from three layers.

7. A semiconductor memory according to claim 1, wherein each of said first level interconnection layers is formed from a single layer of a material chemically not easily reactive with said capacitance insulating film nor with said semiconductor substrate.

8. A semiconductor memory according to claim 7, wherein said capacitance insulating film is formed from a ferroelectric material.

* * * * *